United States Patent [19]

Bell

[11] 4,098,637
[45] Jul. 4, 1978

[54] PROCESS FOR THE PRODUCTION OF A PLANAR CONDUCTOR PATH SYSTEM FOR INTEGRATED SEMICONDUCTOR CIRCUITS

[75] Inventor: Guido Bell, Gilching, Germany

[73] Assignee: Siemens Aktiengesellschaft, Berlin & Munich, Germany

[21] Appl. No.: 714,599

[22] Filed: Aug. 16, 1976

[30] Foreign Application Priority Data

Sep. 3, 1975 [DE] Fed. Rep. of Germany ....... 2539193

[51] Int. Cl.$^2$ .................. B23P 15/00; B23P 25/06
[52] U.S. Cl. .................... 156/644; 156/656; 156/657; 156/659; 156/665; 427/90; 427/93
[58] Field of Search ............... 204/15, 33, 38 A, 42, 204/58; 427/82, 89–91, 399; 156/8, 11, 17, 22, 644, 653, 655, 659, 661, 665, 667, 656, 657; 29/576, 580, 591

[56] References Cited

U.S. PATENT DOCUMENTS

| | | | |
|---|---|---|---|
| 3,723,258 | 3/1973 | Podell et al. ................. | 204/58 X |
| 3,759,798 | 9/1973 | Graff et al. ................... | 427/90 X |
| 3,827,949 | 8/1974 | Platter et al. ................. | 204/15 |

OTHER PUBLICATIONS

IBM Technical Disclosure Bulletin, vol. 16, No. 3, Aug. 1973, Anodization Process for Planarization of Aluminum–Copper–Silicon Metallurgy by G. Lhote, pp. 1010 and 1011.

Primary Examiner—William A. Powell
Attorney, Agent, or Firm—Hill, Gross, Simpson, Van Santen, Steadman, Chiara & Simpson

[57] ABSTRACT

Process for the production of a planar conductor path system for integrated semiconductor circuits which includes forming a metal layer on a planar surface of a base, forming a masking layer on the metal layer over those regions where the conductive path is to be, oxidizing electrolessly in acqueous solution those areas of the metal layer not covered by the masking layer.

12 Claims, 14 Drawing Figures

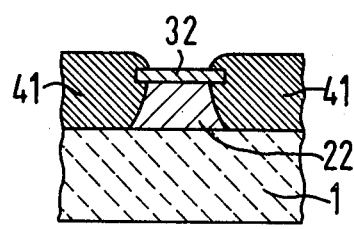
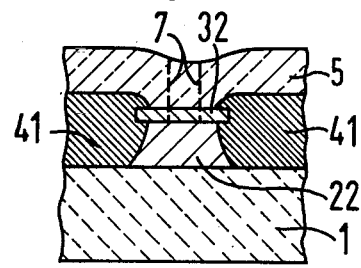
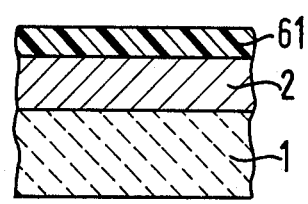
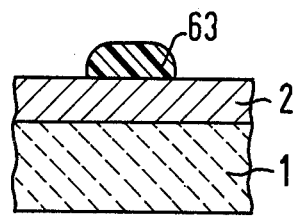
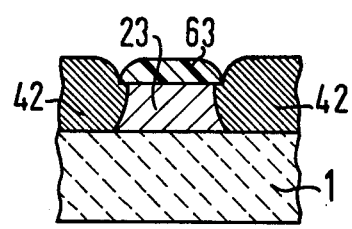
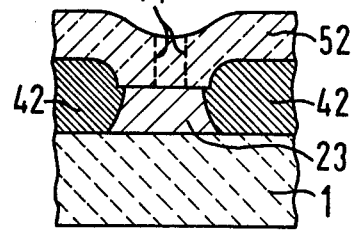

PROCESS FOR THE PRODUCTION OF A PLANAR CONDUCTOR PATH SYSTEM FOR INTEGRATED SEMICONDUCTOR CIRCUITS

BACKGROUND OF THE INVENTION

The invention relates to a process for the production of a planar conductor path system for integrated semiconductor circuits.

By a photo-lithographic etching technique, conductor paths are produced on a semiconductor surface. This leads to considerable profiling of the semiconductor surface. A passivation layer applied upon the latter, and which can consist, for example, of sputtered $SiO_2$, frequently only insufficiently covers the edges of the etched portions and then is unable to fulfill the desired function. Thus, for example, the passivation layer is not sufficiently flat for a second metallization layer to be applied subsequently.

In order to avoid a heavy profiling of the metallization plane, it is known, instead to remove the unrequired metal to convert these zones into non-conductive regions.

Thus, for example, in H. Tsanemitsu and H. Shiba, NEC Research and Development, 25, p. 74–80 (1972), the aluminum is converted as follows: First, the aluminum is applied to the whole of the surface of the semiconductor arrangement. The geometry of the conductor paths is subsequently covered with thin but densely pored oxide in a photolithographic process. When the photo lacquer required for the photolithographic process has been removed, the exposed aluminum which is not required is entirely converted into porous oxide in another anodization process. Here the first, dense oxide serves as protective mask for the underlying metal. The metal paths are thus separated from one another by the porous oxide.

The same process for aluminum layers to which silicon or copper is added as an alloy component is known. It is necessary to modify the process as with aluminum-copper and aluminum-silicon alloys for it is not readily possible to form pore-free forming oxide.

A fundamental disadvantage of these processes lies in the fact that the thick, porous oxide is produced electrochemically. This requires on the one hand additional conductor paths solely for this process, and on the other hand the current supply through the metal layer which is to be converted at the end of the process is not guaranteed. This results in the fact that residues of metal remain on the base - that is, the surface on which the aluminum or Al alloy is applied to the base - of the oxidized zones. They are joined on the underside to the base, for example, to insulating $SiO_2$. The newly formed oxide, however, separates them from the current conducting layer which is becoming increasingly thinner. Thus, a reliable and complete conversion of the zones between the conductor paths is possible only at random. This fault can lead to short-circuits during operation.

SUMMARY OF THE INVENTION

It is an object of the present invention to provide a process in which the production of the conductor paths leads to as small as possible a profiling of the surface of the semiconductor arrangement.

This is achieved by a process which includes forming a metal layer on a planar surface of a base, forming a masking layer on the metal layer over those regions where the conductive path is to be, oxidizing electrolessly in aqueous solution those areas of the metal layer not covered by the masking layer.

Advantageously, in the process in accordance with the invention, not only pore-free forming oxide, but also photo lacquer can be used as a mask for those zones which are not to be converted.

In the following, the invention will be explained in detail making reference to the description and to the Figures.

BRIEF DESCRIPTION OF THE DRAWINGS

FIGS. 1 to 5, 6 to 10 and 11 to 14 schematically illustrate three different variants of the process of the present invention.

DESCRIPTION OF THE PREFERRED EMBODIMENTS

First, the process of the invention will be described making reference to FIGS. 1 to 5. The base upon which the aluminum conductor paths are to be applied is referenced 1. This base can, for example, be an insulating layer applied to a semiconductor material. For example, this can be a $SiO_2$ layer applied to a silicon semiconductor body. The base 1 can also be the semiconductor material itself, preferably a silicon body. First, the base 1 is covered on one surface with an aluminum layer 2 or a layer consisting of an aluminum alloy, for example, an aluminum-copper alloy. Next, a forming layer ($Al_2O_3$) 3 is applied to the whole of one surface of the aluminum or aluminum alloy layer 2. This layer 3 is deposited on the layer 2 over its entire surface. Here the oxide layer which on account of the high affinity between aluminum and oxygen is constantly deposited on the aluminum layer, is reinforced by anodic oxidation to form a layer which exhibits a good surface quality and other favorable properties. The aluminum or aluminum alloy layer 2 serves as anode. When a suitable selection has been made for the electrolyte, pore-free thin layers can be deposited in a known manner. Here when the current is constant, the layer thickness is determined by the voltage which is applied. The process is well known in the prior art.

Figure 1:
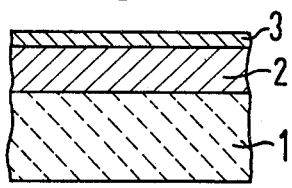
Figure 2:
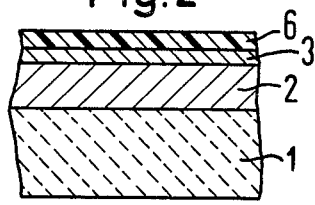
Figure 3:
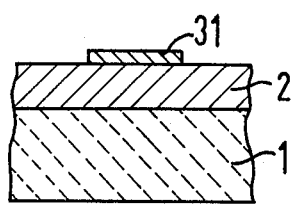

Using photolithographic process steps, the structure of the conductor paths or the conductor path system is produced. For this purpose, the aluminum oxide layer 3, as illustrated in FIG. 2, for example, first is covered on the whole of its surface with a photo lacquer layer 6. Then this photo lacquer layer 6 is exposed and developed in a further process step. Here, as illustrated in FIG. 3, after the removal of the remaining photo lacquer layer, those parts 31 of the forming layer 3 remain, under which a conductor path or an electrically conductive aluminum circuit is to be produced.

Figure 4:
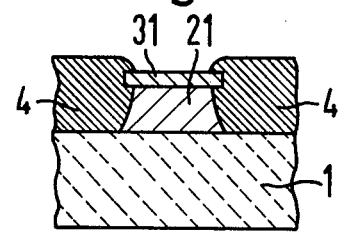

Thereafter, as illustrated in FIG. 4, the open zones of the aluminum or aluminum alloy layer 2 which are not covered with aluminum oxide layers 31 are oxidized electrolessly in aqueous solutions such as described, for example, in the "Handbuch der Galvano-Technik", Dettner-Elze, Edition III. It should be noted that this oxidation step is not carried out electrolytically and does not have the associated disadvantages of an electrolytic oxidation step. The oxide layers 4 which are formed by the electroless step, are advantageously porous. Because of this, a high-speed growth is assured, since the aqueous solutions can always penetrate through to the remaining aluminum or to the remaining aluminum alloy through the aluminum or aluminum alloy which has already been oxidized in porous fashion. With the aid of this process step, metallization layers are completely converted in the technologically normal layer thickness in the order of microns. During the conversion, the pore-free forming oxide layer 31 serves as a mask. For example, the oxidation is carried out in an aqueous solution consisting of 1% hexamethylene tetramine in $H_2O$ at a temperature of 90° C for approximately one hour.

Figure 5:
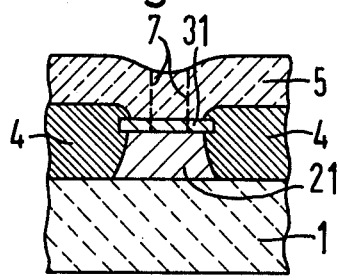

As likewise illustrated in FIG. 5, a protective layer 5, which, for example, is a $SiO_2$ layer, is subsequently applied by sputtering to the arrangement shown in FIG. 4.

In further process steps, connection spots are etched in a known manner for the purpose of contacting. Here openings are produced which extend through the protective layer 5 and through the forming oxide 31. In FIG. 5, such an opening is indicated by the broken lines 7.

Figure 6:
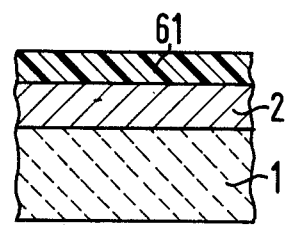
Figure 7:
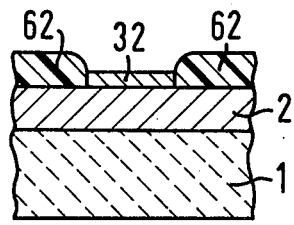
Figure 8:
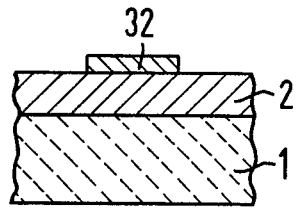

Making reference to FIGS. 6 to 10, a variant of the process embodying the invention will be described. This variant is again based on the layers 1 and 2 already described in association with FIG. 1. As illustrated in FIG. 6, first a photo lacquer layer 61 is applied to the whole of the surface of the layer 2 composed of aluminum or an aluminum alloy.

This photo lacquer layer 61 is now exposed and developed for the production of the conductor path structures. Here parts 62 of the photo lacquer layer 61 remain under which no aluminum or aluminum alloy of the layer 2 is to be arranged later. At those zones at which the conductor path structures are later to run, the photo lacquer layer 61 is removed. Densely pored forming oxide layers 32 are introduced into the openings having been produced in this way, in the manner already described in association with FIG. 1.

As illustrated, first the parts 62 (FIG. 7) of the photo lacquer layer 61 are removed (as in FIG. 8), so that the forming oxide layers 32, which serve as a mask for the following oxidation step, remain on the aluminum or aluminum alloy layer 2. FIG. 9 illustrates this process which has already been described in association with FIG. 4. In FIG. 9, the porous aluminum oxide layers which correspond to the layers 4 in FIG. 4, are referenced 41. Those conductive material which remain below the forming oxide layers 32 are referenced 22.

FIG. 10 illustrates the application by sputtering of a protective oxide layer 5 already described in connection with FIG. 5. The broken lines 7 again represents a contact opening projecting through the protective layer 5 and through the forming oxide 32.

Making reference to FIGS. 11 to 14, a further embodiment of the process of the invention will now be described. This embodiment is again based upon the layers 1 and 2 already described in association with FIG. 1. As again already described in connection with FIG. 6, first a photo-lacquer layer 61 is applied to the entire surface of this arrangement.

This photo-lacquer layer is exposed and developed, so that, as illustrated in FIG. 12, parts 63 of the photo-lacquer layer 61 remain at those points at which the conductor path structures are later to run. These parts 63 of the photo-lacquer layer 61 serve as mask for the electroless oxidation in the following process step illustrated in FIG. 10. This oxidation is represented in FIG. 13, in which the porous oxidized zones 42 are formed. The conductor path 23 remains beneath the lacquer layer 63 which serves as a mask.

The arrangement in FIG. 14 is preferably provided by sputtering with a protective layer 52, which is preferably again a silicon dioxide layer. This is done after the photo lacquer portion 63 has been removed. For contacting, the opening indicated by the broken line 71 is etched through this protective layer 52 above the conductor path 23. In contrast to the openings illustrated in FIGS. 5 and 10 relating to the two other embodiments of the process of the invention, the opening 71 only needs be etched through the protective oxide 52, since in this embodiment, no forming oxide layer is provided, and since the photo lacquer layer 63 has been removed prior to the application of the protective layer 52.

It will be apparent to those skilled in the art that many mocifications and variations may be effected without departing from the spirit and scope of the novel concepts of the present invention.

I claim as my invention:

1. Process for the production of a planar conductor path system for integrated semiconductor circuits which includes first applying a metal layer to substantially one entire surface of a base, covering the metal with a layer of masking material, removing all of the masking layer except over those areas where the conductor paths are to be, and thereafter oxidixing electrolessly in an acqueous solution the metal layer underneath the exposed surface.

2. Process for the production of a planar conductor path system for integrated semiconductor circuits which includes first applying a metal layer to substantially one entire surface of a base, covering the metal layer with a non-porous metal oxide, covering the non-porous metal oxide layer with a photo-lacquer layer, exposing and developing the photo-lacquer layer to leave portions of the non-porous metal oxide above where the metal layer is to form the conductor path, and converting the exposed metal layer portions not covered by the remaining non-porous oxide into a porous oxide electrolessly in an aqueous solution.

3. Process according to claim 2, in which said porous oxide layer is covered by an insulating layer, and providing openings through said insulating layer and through said non-porous layer to said conductor path thereby to provide electric connections to the conductor path system.

4. Process for the production of a planar conductor path system for integrated semiconductor circuits which includes first applying a metal layer to substantially one entire surface of a base, covering the metal layer with a photo-lacquer layer, by a photo-lithographic step providing openings through said lacquer layer over the regions of the metal layer where the conductor path is to be formed, providing a non-porous oxide in said openings on said metal layer, removing the remaining portions of the lacquer layer, converting electrolessly in an aqueous solution the portions of the metal layer not lying beneath said non-porous oxide layer into a porous oxide layer, and providing a protective oxide layer by sputtering over the porous oxide layer and over the remaining non-porous oxide portions, and providing openings through said protective layer and through said non-porous oxide layer to the conductor path.

5. Process for the production of a planar conductor path system for integrated semiconductor circuits which includes first applying a metal layer to substantially one entire surface of a base, covering the metal layer with a photo-lacquer layer, by a photo-lithographic process removing all portions of the photo-lacquer layer except over regions where the conductor path is to be formed, converting electrolessly in an aqueous solution all exposed portions of said metal layer to a porous oxide except where the metal layer is covered by said remaining photo-lacquer layer, removing the remaining portions of said photo-lacquer layer, covering said porous oxide layer with a protective oxide coating, and providing openings through said protective oxide layer to the conductor paths.

6. Process according to claim 1, in which the base comprises a silicon dioxide layer applied to a semiconductor body.

7. Process according to claim 1, in which the base is a silicon semiconductor layer.

8. Process according to claim 1, in which the metal layer is aluminum.

9. Process according to claim 1, in which the metal layer is an aluminum alloy.

10. Process according to claim 1, in which the masking layer is $Al_2O_3$.

11. Process according to claim 1, in which the aqueous solution is 1% hexamethylene tetramine in water.

12. Process according to claim 11, in which the oxidation of the metal layer by the aqueous solution is carried out at a temperature of 90° C for approximately one hour.

* * * * *